Figure 1:
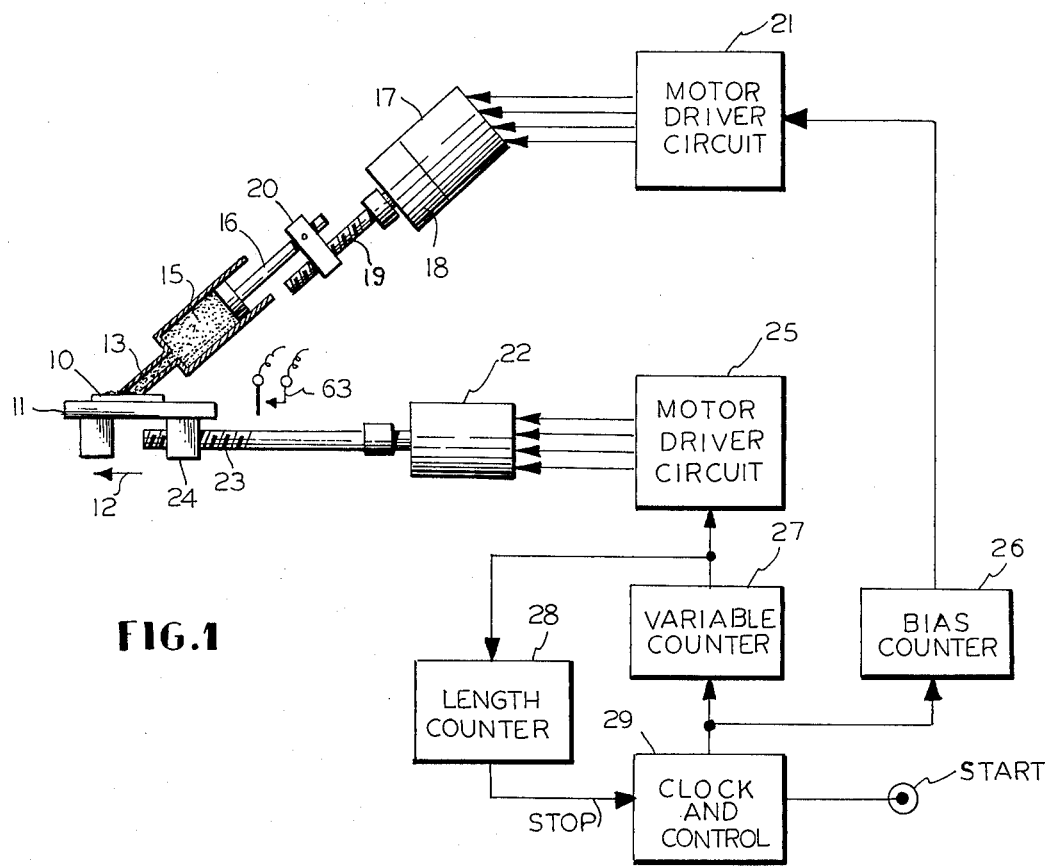

United States Patent [19]
Jones, Jr.

[11] 3,961,599
[45] June 8, 1976

[54] APPARATUS FOR MAKING MINIATURE LAYER RESISTORS ON INSULATING CHIPS BY DIGITAL CONTROLS

[75] Inventor: John Paul Jones, Jr., Wayne, Pa.

[73] Assignee: Air Products and Chemicals, Inc., Allentown, Pa.

[22] Filed: Oct. 25, 1973

[21] Appl. No.: 409,589

Related U.S. Application Data

[63] Continuation of Ser. No. 171,144, Aug. 12, 1971, abandoned.

[52] U.S. Cl. .................................. 118/6; 118/7; 118/11; 118/410
[51] Int. Cl.² .................... B05C 5/02; B05C 11/10
[58] Field of Search ............... 118/6, 7, 8, 11, 410, 118/411, 415, 238, 24, 25; 29/420; 425/113

[56] References Cited
UNITED STATES PATENTS

| | | | |
|---|---|---|---|
| 2,412,295 | 12/1946 | Shaffer, Jr. ................ | 118/410 X |
| 2,960,060 | 11/1960 | Chatterton .................. | 118/11 |
| 2,981,211 | 4/1961 | Emerzian .................... | 118/24 X |
| 3,088,434 | 5/1963 | Sprague et al. ............. | 118/410 |
| 3,356,071 | 12/1967 | Brown ........................ | 118/410 |
| 3,502,752 | 3/1970 | Brown ........................ | 425/113 X |
| 3,521,599 | 7/1970 | Bentzinger .................. | 118/6 |
| 3,531,615 | 9/1970 | Zammit ....................... | 118/8 X |

FOREIGN PATENTS OR APPLICATIONS

| | | | |
|---|---|---|---|
| 35,105 | 10/1905 | Switzerland ................. | 118/238 |
| 788,553 | 1/1958 | United Kingdom ........... | 118/317 |

Primary Examiner—John P. McIntosh
Attorney, Agent, or Firm—James C. Simmons; Barry Moyerman

[57] ABSTRACT

A capsule of ink-like paste is dispensed in a rectangular layer a few mils thick and a few hundreths of an inch in width and breadth on an insulating chip by a piston and nozzle assembly. The piston is driven by a stepping motor-screw assembly to dispense an accurately metered amount of the ink to establish a resistance value. The nozzle and chip are relatively moved by a stepping motor-screw assembly. An electronic control circuit operates the two stepping motors simultaneously to lay down resistors.

9 Claims, 7 Drawing Figures

INVENTOR
JOHN PAUL JONES, JR.

BY *Lawrence R. Brown*
ATTORNEY

INVENTOR
JOHN PAUL JONES, JR.

BY Laurence R. Brown
ATTORNEY

APPARATUS FOR MAKING MINIATURE LAYER RESISTORS ON INSULATING CHIPS BY DIGITAL CONTROLS

This application is a continuation of application Ser. No. 171,144, filed Aug. 12, 1971, now abandoned.

This invention relates to miniature printed or hybrid circuits and more particularly it relates to the manufacture of printed miniature resistors on insulating chips.

In hybrid printed circuits many components are miniaturized and resistors are made of resistive inks or pastes made of precious metals are laid down in layers on ceramic chips and fired. At the present state of the art, the resistors are applied by a screen process. Thus, a woven wire screen charged with inks has a pattern of small apertures for squeezing out a resistive film on the chip. The chips are then baked.

Among problems existing in the screen process is the large amount of waste of high-cost materials, the difficulty in attaining consistent results and high set-up and tooling costs.

For example, the screens contain large amounts of expensive ink that must be cleaned out and wasted after each operation, making impractical small runs of a few resistors at reasonable costs. Furthermore, the pastes contain volatile binders which in the screen are exposed to air and thus the consistency and resistivity may be changed or impurities, moisture or bubbles may be introduced resulting in large inconsistencies in the resistors made in this manner. This leads to the need to pre-test the resistors for each run to assure proper tolerances and results.

Furthermore, different values of resistors may require different inks so that different screens or tools must be used and firing must be done between runs of different resistor values. This may result in poor yields of more complex and expensive products. The time taken to set up the tooling and check out the results is considerable and the economics of such production techniques deter the ability to produce runs of small quantities of specialty circuits.

In particular, the process requires skilled techniques with personnel using skill and judgement to produce circuits within reasonable percentages of component tolerances. There is no apparent successful prior art way of metering precise resistance values of varying resistance or correcting for variations of production without retooling or reinking. Thus, it is necessary to provide resistance layers which may be touched-up with sand blast or removal processes to correct errors.

It is, therefore, an object of this invention to improve the art of manufacturing miniature film resistors by providing new systems and methods.

More specific objects of this invention are as follows:

To provide a system of dispensing expensive conductive and resistor pastes with negligible losses of the pastes.

To prevent contamination and variation of pastes when used over long periods of time.

To provide close tolerances of resistance consistently with simple techniques using unskilled personnel.

To provide a system for simple adaptation to different resistor values and physical dimensions without special tooling set-up times.

To eliminate the need for test runs to determine resistive tolerances.

To provide a system for economically making short runs of complex components with little waste and with good yields.

To provide a system for metering out precisely various resistance values on a precise preselection basis which will preclude touch-up techniques.

Resistors printed from conductive inks have a finished resistance value based upon the thickness, width and length of a layer put down generally in a rectangular form. The paste resistivity may change to give different ranges of resistance values within reasonable sized geometric areas. The areas laid down by the screen process are incapable of changing after the tooling process so that all the changes must come from variations of ink resistitity, which puts the consistency problem in the realm of art of a skilled human technician.

This is overcome by the present invention which provides a capsule or tube of ink with a piston and spout such as a hermetically sealed hypodermic syringe so that the ink may be precisely metered out in an exactly known thickness, width and length. In this manner, the ink is kept from contamination and waste and capsules may be readily changed with different size spouts or different resistance inks.

A dispensing meter comprises a stepping motor and lead screw micro-positioning arrangement which is controlled by electrical impulses that are selected by dial settings on a counter to thereby preclude the necessity of skilled techniques or significant labor time in set-up or production. This also permits vernier adjustments to resistance values which can be set up with variations in processing, if desired, by on-line feedback from finished baked printed circuit assemblies so that consistent quality control is assured even when manufacturing variations cause small drifts in resistance values. By changing capsules various resistors may be laid down on different positions on the ceramic chip for a single baking cycle which leads to greater consistency in manufacturing techniques and eliminates the problems of variations because of changes encountered in multiple bakes. This also reduces the labor and time cycle and the number of operations that can lead to defects.

Figure 2:
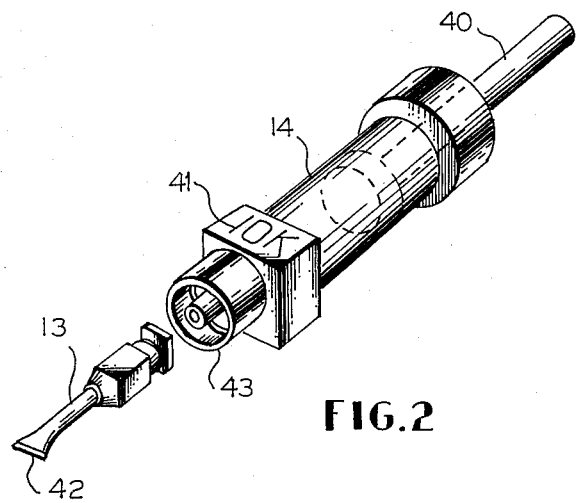
Figure 3:
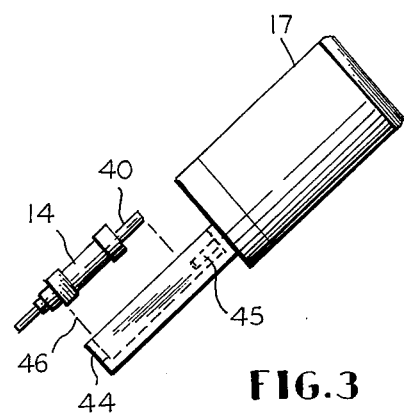
Figure 4:
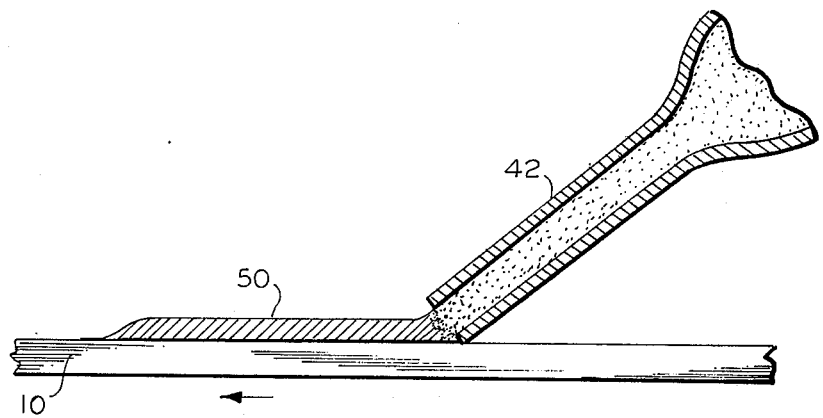
Figure 5:
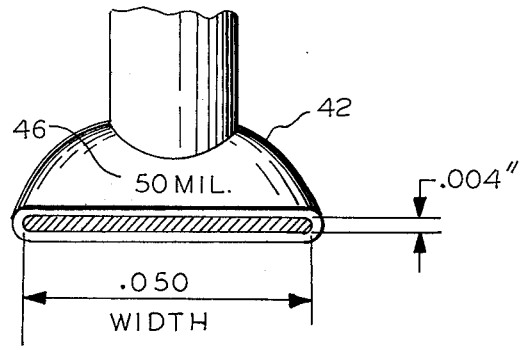
Figure 6:
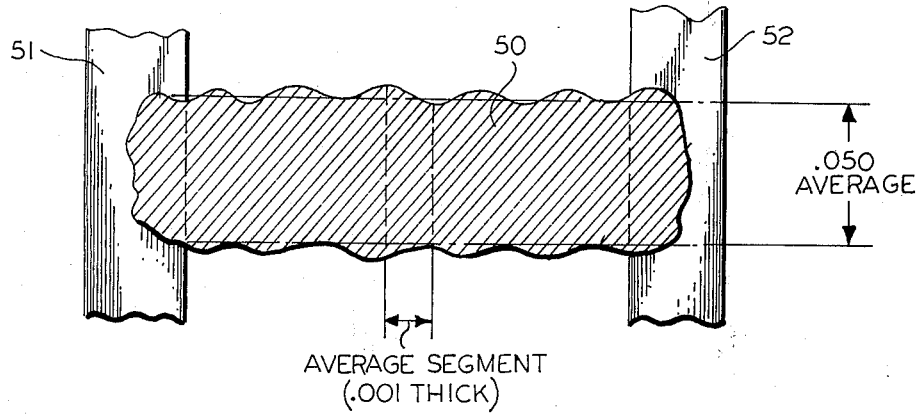
Figure 7:
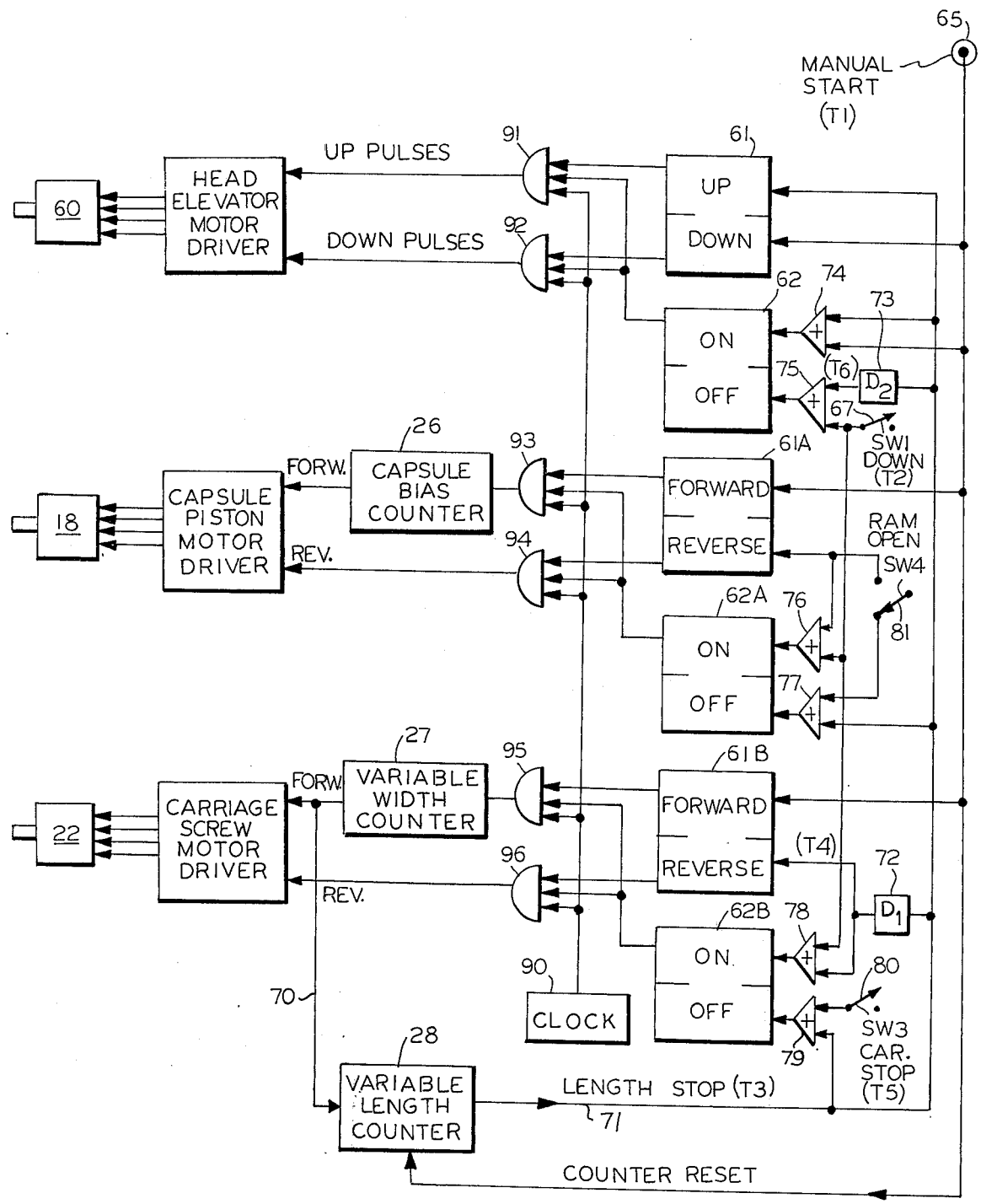

A further description including features, objectives and advantages of the invention follows, with reference to the accompanying drawing, wherein:

FIG. 1 shows a system for producing resistors including a sketch of a resistive paste metering capsule, nozzle and table assembly, partly in section, and an electronic control system in block diagram, FIG. 2 shows in perspective an ink cartridge with a removable nozzle in exploded form, FIG. 3 shows a motor capsule drive assembly with removable capsule shown in exploded form, FIG. 4 shows in enlarged section view the nozzle and a substrate assembly in the process of laying down a printed miniature resistor, FIG. 5 is an elevation partial view of the spout of the nozzle assembly, FIG. 6 is a diagrammatic view of a miniature resistor film in place on a portion of a hybrid circuit chip, and FIG. 7 is a logic block diagram of electronic control circuits.

With reference to FIG. 1, it is seen that a hybrid circuit ceramic chip or substrate 10 is mounted on a movable table 11 which relatively passes to the left as shown by arrow 12 with respect to the spout 13 of a hermetically sealed hypodermic type dispenser 14 having therein a supply of printed circuit resistor paste or ink 15 which can be metered out in small doses by means of piston 16.

The ink dispensing piston 16 is driven by stepping motor 17 which has a gear box 18 and an intermediate worm 19 and threaded block 20 to provide micrometer type steps of piston 16 in response to each electrical step impulse from motor driver circuit 21. This arrangement permits accurate metering and dispensing of very minute precisely measured volumes of ink from the spout 13 onto the chip 10.

The table 11 is moved in small increments by step motor 22 to give relative movement to the chip 10 held thereon with respect to the spout 13 by medium of a worm 23 and threaded block 24. Motor driver circuit 25 provides step-by-step drive pulses to motor 22.

The electronic control circuits include the presettable electronic counters 26, 27, 28 which control the volume of ink, the table drive and the ratio of ink dispensing rate to the table movement from clock pulses received from oscillator-control circuit block 29. Thus, the controls for relatively moving the chip 10 and metering the ink 15 from spout 13 onto the chip 10 as a function of relative movement are synchronously controlled, and may be precisely regulated by counting oscillator pulses metered out to the two stepping motor drives 21, 25.

The pre-settable counter 27 meters out enough pulses to dispense on exact volume of ink required to make a resistance of desired predetermined value. The count can be varied after testing to change the dispensed volume and thus the resistance by small increments to compensate for any variations that may occur in the manufacturing process. In general, with a capsule having ink of known resistivity which has enough volume for thousands of resistors, adjustments need not be made to the counter, and it can be preset or predialed to provide resistance values within the range established by the resistivity of the ink, the spout dimensions, the length of the resistor, and the thickness of the resistive film.

The presettable counter 28 meters out the desired number of pulses for moving table 11 and thus establishes the length of the resistor by relative movement of spout 13 and chip 10. The variable thickness counter 27 determines the thickness of the paste by adjusting the relative movement of the table to counter 26 so that it controls the thickness of the ink layer deposited on the chip. Thus, simple and complete precision controls permit the development of many different resistance values without changes of tooling, other than spouts 13, which change the width of the resistance film, and of capsule 14, which changes the resistivity of the ink.

Typically, a bore of 0.187 inches in the ink capsule provides 135 times the area of a 0.050 inch wide ribbon of 0.004 inch thickness. Thus, the table will move 135 times the piston movement, as may be established by gearing in gear head 18, for example. Likewise, the thickness counter 27 is adjusted when the width of the spout is changed to maintain the volume of dispersed ink such that thickness may be held constant. For example, if the width is doubled, the table speed should be halved. The width counter 27 is preferably used for touch-up of resistance values, since it will control the resistance value of the deposited layer.

Fig. 2 illustrates the snap-in or removable capsule and spout arrangement. Different spouts may have discharge blade widths at 42 chosen to provide resistors of several standard widths, such as 0.050 inch, 0.100 inch and 0.150 inch. The spouts are snapped on to capsule discharge stem 43. Each capsule is likewise replaceable and, therefore, has a resistivity identity 41. The built-in plunger 40 permits the capsule to be inserted; and when the spout 13 is in place, the electronic circuits may be hand stepped until the plunger 40 is in contact with the stepping motor drive RAM (45), and spout 13 is filled and ready to lay down a layer of the desired ink. A typical piston movement for each pulse is 10 microns.

It is noted that the orifices of the capsule 14 and spout 13 are so small that the evaporation of volatile ink ingredients cannot take place and impurities cannot enter, so that completely uniform characteristics may be expected over the life of the capsule contents in laying down many thousands of thin film resistance layers, all with very little waste. This makes possible the use of thin film resistors in small quantity runs and in the production of "precision" resistors where very close control of resistivity is necessary without after-production touch-up by scraping away part of the layer. Also, it is clear that the resistance values can be dialed in by unskilled operators from charts or tables and the system need not require a skilled artisan who will need to operate a screen or a roller differently as the ink dries or to attain compensations in resistance values.

FIG. 3 shows the typical arrangement of a stepping motor drive assembly 17 with attached cradle 44 for receiving the capsule-spout assembly 13, 14, as inserted along arrows 46, with drive piston plunger 40 engaging the stepping motor ram 45.

FIGS. 4 and 5 show an enlarged view of the extrusion spout laying down an extruded film resistor 50 with a spout width having a legend 46 identifying the resistor width. The opening is for a typical resistance layer thickness of 0.004 inches, which, when fired, will be reduced to a standard thickness of 0.001 inches.

With this type of extrusion dispensor, resistors of different values may be deposited at different positions on the chip and all fired at one time. With a screen process, the firing must be done before a resistance of different ink content is put on the chip. Thus, better uniformity and tracking of all resistors is attained because of the uniform firing history by the present method. Also, a greater tolerance in the range of ink viscosity is possible since the problems of clinging to a screen, etc., are eliminated.

Even with some variations of physical properties, such as width or thickness, encountered, as depicted by the layer resistor 50 laid down between conductors 51 and 52 shown in FIG. 6, the resistance value will remain very close as long as the average thickness and the average width is attained closely.

FIG. 1 shows a diagram of the basic elements in simple form, for clarity. The diagram, as shown, has the extrusion nozzle already poised on the ceramic subplate. The system control boxes are limited to the elements necessary to carry out one extrusion stroke by the machine. For example, no provision is shown for lifting the drive head completely off of the ceramic substrate at the end of the deposition cycle.

The main purpose of the counter "blocks," as shown, is to synchronize both the movement of the base carriage and the motion of the ink extrusion piston. The ratio of the base movement to the extrusion piston movement determine the cross sectional area of the material that is deposited.

The system may be explained to include:
1. A vertical axis control on the working head.
2. A STOP switch on the base carriage table 11, which would set its return point; after the length counter has reached its preset number, reversed and returned to the STOP switch position.
3. Limit switches on the horizontal drive system, the vertical drive system, and the extrusion cylinder drive system. These will prevent accidental over-travel, in the event that the control logic should be upset by high level external noise sources.

In FIG. 1, the timing and control of the system is generally located in the clock and control "box" 29.

In FIG. 7 a more complete block diagram of the actual control system is shown, without the mechanical interface elements. In this diagram some of the various manual controls which are necessary for the setting up or adjustment of the system; and for changing the capsule, etc., are shown.

In FIG. 7 the control logic performs several basic functions. First, the control logic sets up a sequence of actions for the extrusion head and the associate moving table. Secondly, it sets up both the direction and speed of the three digital stepping motors which are utilized for controlling the head. Thirdly, it sets up the proper ratio of clock pulses to the capsule piston drive motor and the carriage screw drive motor. In addition to these basic functions, the control logic includes various limit switches, manual controls, etc.

In the control logic block diagram of FIG. 7 the three stepping motors 18, 22 and 60 are shown, with their associate driver circuitry and control logic. The sequence of operations is labelled by the use of time stations, such as (T1), (T2), etc. Notice that each motor driver is controlled by a pair of flip-flops 61–62. One flip-flop 61 is to control the direction of the motor driver circuitry and the other flip-flop to control the ON and OFF gating of the "clock" to the motor driver circuitry. The use of these flip-flops allows momentary signals to be used for changing direction and turning the motors OFF and ON, since the flip-flops will remain in "state" and "remember" the last command until a new command changes the state.

The operating sequence would normally begin with the extrusion head located above the ceramic plate, which has been located against a suitable metered stop (not shown) on the carriage. When a start pulse is introduced to the system, it causes the extrusion head to lower quickly until it contacts the ceramic plate. At that exact moment the carriage should begin to move in a linear fashion under the head, while the head simultaneously extrudes the resistive or conductive material by means of the synchronized capsule piston driver.

At the end of a preset length of motion, the carriage should stop, and the extrusion head should immediately start lifting off the substrate; and the extrusion piston should simultaneously cease operation. As soon as the extrusion head has parted from the substrate, the carriage, after a short delay, should immediately begin moving back to the start position, to accept a new substrate. The carriage quickly returns until it bumps a stop switch 63 (FIG. 1), which accurately sets the end of the return cycle and the start point of the new cycle. The head, after lifting from the base plate, should also stop automatically at a predetermined height above the substrate. This can be at a time which is random to the time that the carriage has reached its "home" position.

With reference to the block diagram of FIG. 7, the control logic would operate as follows:

Depression of the manual start button (not shown) will initiate a signal at a time ($T_1$) at terminal 65. The start pulse (1) sets the head elevator motor to the down position at flip-flop 61, (2) turns the head elevator motor driver on at flip-flop 62, (3) sets the capsule piston motor control flip-flop 61A in the forward state, (4) sets the carriage screw motor flip-flop 61B in the forward state, and (5) resets the variable length counter 28 to zero.

The head elevator motor, therefore, begins to move the head quickly downward until it engages the substrate where a limit switch 67 closes and produces a down signal at time (T2), which turns off the head elevator motor at flip-flop 62. At this time (T2) the capsule piston motor driver is turned on at flip-flop 62A and the carriage screw motor driver is also turned on at flip-flop 62B. Both of these motors continue to operate together in the forward direction, and at a ratio that is set up between the piston bias counter 26 (which is normally fixed) and the variable width counter 27 (which is adjusted) to give the exact ratio of piston drive pulses to carriage screw drive pulses.

The third variable counter 28, which is used to determine the length of the extrusion, is driven from the pulses that are actually introduced to the carriage screw motor driver, at lead 70. Each pulse may, for example, produce a 0.001 inch incremental drive on the carriage. These increments or pulses, are counted by the variable length counter which will eventually produce a stop pulse on lead 71 at time (T3); which signals the end of the actual extrusion of material on the base plate, or substrate.

The stop pulse from the variable length counter 28, (1) turns off the carriage motor screw driver at flip-flop 62B, (2) turns off the cpasule piston motor driver at flip-flop 62A, (3) turns on the head elevator motor driver at flip-flop 62, and (4) sets the head elevator driver to the up condition at flip-flop 61. This stop pulse at time (T3) also triggers two delays 72, 73. The D1 delay 72 turns on the carriage screw motor driver at flip-flop 62B and sets it into the reverse condition at flip-flop 61B shortly after the head has been raised from the substrate; at time (T4). The delay D2 (73) is set to raise the head the desired distance above the substrate, (for introducing a new substrate easily), and the delayed stop pulse for the head elevator motor, at (T6), turns the head elevator motor off at flip-flop 62. Mixer (OR) circuits 74–79 can combine control pulses from various other sources to the flip-flops.

The reverse movement of the carriage screw, which returns the carriage to the home position, continues until it reaches the variable stop limit switch 80 ($SW_3$) which produces a stop signal (T5) which turns the carriage screw motor driver off at flip-flop 62B.

The signals (T5) and (T6) occur at the end of the complete cycle and could be used to initiate a new automatic injection of a substrate plate into the carriage holder of the machine.

The oscillator clock pulse source 90 provides count pulses and drive pulses for the various step motors and counter circuits by medium of the "and" gates 91–96, when all the input signal conditions coincide. The clock pulse oscillator frequency can be chosen to give proper operational speeds for the counters and stepping motors.

Other manual controls, such as an up button, a down button, etc., which can be used for adjusting or manually operating all phases of the head, are not shown on this diagram for the sake of clarity. These controls would be simply combined into the OR logic or "mixer" inputs 74–79 at the inputs of the control flip-flops.

CALIBRATION OF THE VARIABLE COUNTERS

It is the variable "width" counter and the capsule bias counter which operate together to give the proper ratio of carriage motion to capsule piston motion.

In practice, the capsule bias counter will remain essentially fixed; and would be changed only when there is an extreme change of range.

The variable width counter controls the speed of the carriage screw motor when it is moving in the forward direction. It is called a width counter, since counter digital-decimal dials (not shown) which are set up to determine the count rate are calibrated to the width of the extrusion. This is possible since there is a standard thickness for inks and conductors which is recommended by the manufacturer, and which is used for calibration of the ohmic values of the ink.

The machine is designed to give a value of resistance that is very close to the estimated value on the first "printing." To do this, (1) the variable length counter is set to the length that is designed by the circuit designer, and (2) the variable width counter is set to the width of the extrusion blade, (which is also prescribed by the designer). These two settings, in conjunction with the correct ink resistivity, will produce a resistor value which is very close to the calculated value. The resistance will be close enough to be corrected in one step by changing the original setting on the variable width counter by the appropriate amount. A typical center value for the variable width counter would be 0.050, when using an extrusion blade which has an inside diameter of 0.050. The machine is so designed that the 0.050 counter setting will produce the appropriate film thickness with a 0.050 blade. The capsule bias counter 26 is preset to a divide number which is approximately the center of the width range; and allows the variable width counter 27 to be set both above and below the average center values.

The manual entry of the digital counter settings would normally be done with rotary dials or "Thumb-switches." It is obvious from the discussion and the means of digitally setting the counters that the machine can be easily programmed from a remote location (which could be an on-line test location) or tied into automatic or semi-automatic machinery. The manual select switches can be replaced by a mechanical rotary switch or by other solid state circuitry, which, in turn, can be easily controlled or changed from a remote location.

What is claimed is:

1. A system for producing miniaturized flat layer electronic components including resistors of the order and magnitude of a mil in thickness and of a few hundredths of an inch in width and length by coating a flat insulating chip with a paste-like ink material, comprising in combination, a chip, a hypodermic syringe-like capsule for holding and dispensing a supply of said ink having a dispensing spout with an opening therein approximately the width and thickness of the component to be placed on said chip, positioning means for supporting said chip adjacent said dispensing spout, said positioning means comprising a moveable table for supporting said chip, said table connected to a drive mechanism controlled by a stepping motor so that said table can be moved in relation to said spout for a precisely determined distance and at a precisely determined speed, and metering means for dispensing during said movement a metered amount of ink from the spout on said chip to form a coating thereon wherein the capsule has an ink supply chamber with a movable piston therein so constructed to exclude air from contacting said ink in said capsule, said metering means comprising a piston drive mechanism including a threaded screw assembly connected to said piston and a stepping motor drive therefor said stepping motors including electronic circuits synchronized simultaneously and having various controls for establishing the numbers of steps taken by each of the stepping motors thereby establishing the quantity of ink dispensed, the table movement and thus the length and thickness of the coating on the chip.

2. A system as defined in claim 1 wherein the electronic circuits comprise a presettable counter controlling the number of steps taken by at least one of the stepping motors for the extrusion of each resistor through said spout.

3. A system as defined in claim 2 including a presettable counter controlling the number of steps taken by each motor and a further counter controlling the ratio of the drive steps between the two motors.

4. A system as defined in claim 1 including a presettable electronic counter connected to control the number of steps taken by said stepping motor drive thereby metering out a predetermined volume of ink for forming a coating of predetermined resistance over said distance to produce one resistor.

5. An electronic control system for automatically producing with the same device by means of variable parameters electronic components of different predetermined resistivities and power ratings on a flat chip comprising in combination,
   electronically controlled means for dispensing a film of conductive material of predetermined conductivity and cross section from a metered orifice at at controlled dispensing rate onto said flat chip,
   electronically controlled means for supporting and moving said chip, said means movable in response to an electronic signal specifying a particular distance of movement in order to deposit said film or conductive material on said chip from said orifice over a predetermined variable path length on said chip;
   and electronic control means responsive to a signal specifying a particular resistance value operating said dispensing control means to control said dispensing rate and operating said controlled moving and support means to control the rate of travel of said support whereby different power ratings and resistivities may be controlled by electronically controlling the path length and film thickness of the film deposited on said chip.

6. A control system as defined in claim 5, including electronic switch means for starting a dispensing cycle, and
   control circuits responsive to said switch means for operating said system through a sequence of operations depositing said film on said chip and readying the system for a further control cycle.

7. A control system as defined in claim 6 wherein the control systems responsive to the switch means comprise at least one presettable count counter, clock oscillator means providing periodic pulses, and
gating means to count the counter with oscillator pulses during selected portions of said sequence of operations.

8. A control system as defined in claim 5 including respective stepping motors in said means for relatively moving the chip and orifice and metering said flow of material, a clock pulse source, and wherein said sequence control means and counting means includes respective counters operable from said clock pulse source to step the stepping motors over different predetermined counts.

9. A control system as defined in claim 8 including means responsive to said counters for positioning said orifice on and off said chip.

* * * * *